(12) United States Patent
Karmous et al.

(10) Patent No.: US 12,520,552 B2
(45) Date of Patent: Jan. 6, 2026

(54) METHOD OF MANUFACTURING A SEMICONDUCTOR DEVICE AND SEMICONDUCTOR DEVICE

(71) Applicant: Infineon Technologies Austria AG, Villach (AT)

(72) Inventors: Alim Karmous, Dresden (DE); Olaf Storbeck, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 540 days.

(21) Appl. No.: 17/692,725

(22) Filed: Mar. 11, 2022

(65) Prior Publication Data

US 2022/0302264 A1 Sep. 22, 2022

(30) Foreign Application Priority Data

Mar. 18, 2021 (DE) .......................... 102021106691.3

(51) Int. Cl.
*H01L 21/02* (2006.01)
*H10D 64/01* (2025.01)
*H10D 64/23* (2025.01)
*H10D 62/83* (2025.01)
*H10D 64/62* (2025.01)

(52) U.S. Cl.
CPC ......... *H10D 64/01* (2025.01); *H01L 21/0217* (2013.01); *H01L 21/02247* (2013.01); *H01L 21/0228* (2013.01); *H10D 64/231* (2025.01); *H10D 64/252* (2025.01); *H10D 62/83* (2025.01); *H10D 64/62* (2025.01)

(58) Field of Classification Search
CPC ........... H01L 21/76831; H01L 21/0217; H01L 21/02172; H01L 21/02247; H01L 21/02249; H01L 21/76843; H01L 21/76856
See application file for complete search history.

(56) References Cited

U.S. PATENT DOCUMENTS

| | | | | |
|---|---|---|---|---|
| 3,385,729 A * | 5/1968 | Larchian | ................. | H01L 23/29 148/33.5 |
| 4,113,515 A * | 9/1978 | Kooi | ................. | H01L 21/28185 257/E21.258 |
| 4,564,394 A * | 1/1986 | Bussmann | ........ | H01L 21/31155 257/E21.258 |
| 4,621,277 A * | 11/1986 | Ito | .......................... | H10B 12/03 257/411 |
| 5,834,846 A * | 11/1998 | Shinriki | ............ | H01L 23/53271 257/757 |
| 6,228,701 B1 * | 5/2001 | Dehm | .................... | H10D 1/696 257/E21.011 |

(Continued)

*Primary Examiner* — David A Zarneke
(74) *Attorney, Agent, or Firm* — Murphy, Bilak & Homiller, PLLC

(57) ABSTRACT

A method of forming a semiconductor device is proposed. The method includes providing a semiconductor structure. The method further includes forming an auxiliary layer directly on a part of the semiconductor structure. Silicon and nitrogen are main components of the auxiliary layer. The method further includes forming a conductive material on the auxiliary layer. The conductive material incudes AlSiCu, AlSi or tungsten, and is electrically connected to the part of the semiconductor structure via the auxiliary layer.

20 Claims, 3 Drawing Sheets

(56) References Cited

U.S. PATENT DOCUMENTS

| | | | | |
|---|---|---|---|---|
| 6,342,447 | B1* | 1/2002 | Hoshino | H01L 21/2885 |
| | | | | 438/653 |
| 6,511,575 | B1* | 1/2003 | Shindo | B08B 7/0035 |
| | | | | 257/E21.582 |
| 6,559,050 | B1* | 5/2003 | McKee | H01L 21/76843 |
| | | | | 438/656 |
| 6,992,021 | B2* | 1/2006 | Lin | H01L 21/3185 |
| | | | | 257/E21.396 |
| 8,278,210 | B2* | 10/2012 | Miura | H01L 29/66348 |
| | | | | 438/653 |
| 8,811,056 | B2 | 8/2014 | Fukuzumi et al. | |
| 8,940,615 | B2* | 1/2015 | Sun | H01L 29/7846 |
| | | | | 438/791 |
| 9,583,441 | B2* | 2/2017 | Ogura | H01L 21/76829 |
| 9,721,895 | B1* | 8/2017 | Yang | H01L 21/76855 |
| 9,786,603 | B1* | 10/2017 | Clevenger | H01L 23/5283 |
| 9,953,984 | B2* | 4/2018 | Danek | H01L 21/76876 |
| 10,177,091 | B2* | 1/2019 | Simon | H01L 21/76843 |
| 10,199,267 | B2* | 2/2019 | Khare | H01L 21/76889 |
| 10,529,848 | B2* | 1/2020 | Okumura | H10D 30/668 |
| 10,998,400 | B2* | 5/2021 | Shimizu | H10D 62/157 |
| 2003/0092257 | A1* | 5/2003 | Cheng | H01L 21/2885 |
| | | | | 257/E21.576 |
| 2004/0082200 | A1* | 4/2004 | Lin | H01L 21/26506 |
| | | | | 257/E21.396 |
| 2020/0058546 | A1* | 2/2020 | Cheng | H01L 21/31144 |
| 2025/0062160 | A1* | 2/2025 | Qu | H01L 21/76879 |
| 2025/0062219 | A1* | 2/2025 | Ogino | H01L 23/5226 |
| 2025/0063723 | A1* | 2/2025 | Tang | H10B 12/482 |

* cited by examiner

METHOD OF MANUFACTURING A SEMICONDUCTOR DEVICE AND SEMICONDUCTOR DEVICE

TECHNICAL FIELD

The present disclosure is related to a method of manufacturing a transistor device, in particular to a method that includes forming an auxiliary layer on a semiconductor structure.

BACKGROUND

Technology development of new generations of semiconductor devices, e.g. insulated gate field effect transistors (IGFETs) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. For example, shrinking of device geometries may be accompanied by challenges in view of meeting demands on electric characteristics, e.g. contact resistance or latch-up robustness, associated with conductive fillings in narrow contact holes.

There may be a desire for improving manufacturing methods of electric contact structures in semiconductor devices.

SUMMARY

An example of the present disclosure relates to method of forming a semiconductor device. The method includes providing a semiconductor structure. The method further includes forming an auxiliary layer directly on a part of the semiconductor structure. Silicon (Si) and nitrogen (N) are main components of the auxiliary layer. The method further includes forming a conductive material on the auxiliary layer. The conductive material comprises AlSiCu, AlSi or tungsten and is electrically connected to the part of the semiconductor structure via the auxiliary layer.

An example of the present disclosure relates to a semiconductor device. The semiconductor device includes a semiconductor structure. The semiconductor device further includes an auxiliary layer directly on a part of the semiconductor structure. Silicon and nitrogen are main components of the auxiliary layer. The semiconductor device further includes a conductive material on the auxiliary layer. The conductive material comprises AlSiCu, AlSi or tungsten and is electrically connected to the part of the semiconductor structure via the auxiliary layer.

BRIEF DESCRIPTION OF THE DRAWINGS

The accompanying drawings are included to provide a further understanding of the embodiments and are incorporated in and constitute a part of this specification. The drawings illustrate examples of manufacturing semiconductor devices and together with the description serve to explain principles of the examples. Further examples are described in the following detailed description and the claims.

DETAILED DESCRIPTION

Figure 1:
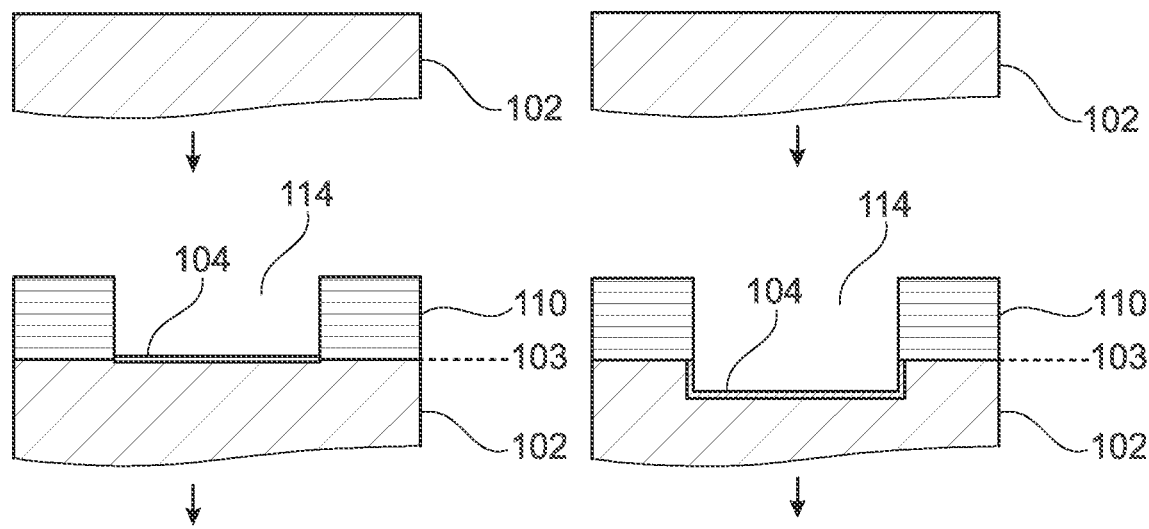
FIG. 1 includes schematic cross-sectional views for illustrating an example of a method of manufacturing an auxiliary layer on a first surface of a semiconductor structure of a semiconductor device.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of the present disclosure relates to method of forming a semiconductor device. The method may include providing a semiconductor structure. The method may further include forming an auxiliary layer directly on a part of the semiconductor structure. Silicon (Si) and nitrogen (N) may be the main components of the auxiliary layer. The method may further include forming a conductive material on the auxiliary layer. The conductive material may include AlSiCu, AlSi, tungsten, or doped polycrystalline silicon. The conductive material may be electrically connected to the part of the semiconductor structure via the auxiliary layer.

The semiconductor device may be a vertical power semiconductor device having a load current flow between a first load terminal or first load contact at a first surface and a second load terminal or a second load contact at a second main surface opposite to the first surface. For example, the first surface may correspond to the surface where the auxiliary layer is formed. The semiconductor device may be a vertical power semiconductor IGBT (insulated gate bipolar transistor), or a power semiconductor reverse conducting (RC) IGBT or a vertical power semiconductor transistor such as a vertical power semiconductor IGFET (insulated gate field effect transistor, e.g. a metal oxide semiconductor field effect transistor), or a vertical power diode, or a vertical power thyristor. The vertical power semiconductor device may be configured to conduct currents of more than 1 A or more than 10 A or even more than 30 A and may be further configured to block voltages between load terminals, e.g. between emitter and collector of an IGBT, or between drain and source of a MOSFET in the range of several tens, or several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example. In some other examples, the semiconductor device may be a lateral power semiconductor device having a load current flow between a first load terminal or first load contact at the first surface and a second load terminal or a second load contact at the first surface. The first and second load terminals are laterally spaced from one another.

The semiconductor structure may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (Site). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor structure may be a Czochralski, CZ (e.g. a MCZ magnetic Czochralski, MCZ), or a float zone (FZ) or an epitaxially deposited silicon semiconductor structure. For example, the semiconductor structure may include a semiconductor substrate, e.g. a semiconductor wafer or a die separated from the wafer after wafer dicing, and one or more epitaxial layers deposited thereon. For, example, the one or more epitaxial layers may be arranged between the semiconductor substrate and the auxiliary layer.

For example, the conductive material may be a filling material of a contact hole. The contact hole may extend through an interlayer dielectric that is arranged on a first surface of the semiconductor structure. The conductive material may be shaped as a contact plug, or as a contact line, or as a contact structure having one or more segments extending along a lateral direction, e.g. a direction parallel to the first main surface. The one or more segments may include shapes of a stripe, a ring or ring segment, or a meander, for example.

For example, the conductive material may be formed as a part of or before forming a first wiring level over the semiconductor structure. Forming the semiconductor device may include forming one or more wiring levels as parts of a wiring area above the semiconductor structure. Each wiring level may be formed by a single one or a stack of conductive layers, e.g. metal layer(s). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another. A first wiring level directly adjoining the conductive material may be a layer including AlSiCu, for example.

Silicon (Si) and nitrogen (N) may be the main components of the auxiliary layer and thus are those elements which atoms form the chemical compound. For example, silicon and nitrogen are the main constituents or main components of a silicon nitride (SiN) layer.

Prior to forming the auxiliary layer, the exposed part of the semiconductor structure may be bare or terminated by hydrogen, e.g. by a chemical cleaning process in a solution including hydrogen fluoride (HF). The exposed part of the semiconductor structure may also be covered by a thin native or wet-chemically grown oxide, for example. The process of forming the auxiliary layer may transform at least partly the thin oxide layer covering the exposed part of the semiconductor structure into silicon oxynitride or silicon nitride constituting part of the auxiliary layer.

The conductive material and/or the one or more wiring level may be formed by one or by a combination of layer formation processes, e.g. by chemical vapor deposition (CVD), electro chemical deposition (ECD), physical vapor deposition (PVD).

Formation of the auxiliary layer provides a number of technical benefits. For example, for semiconductor structures based on silicon, the auxiliary layer may prevent silicon regrowth on a surface of the semiconductor structure that may be caused by an AlSiCu material. Also silicon regrowth within narrow contact holes may be prevented avoiding their complete filling in some locations with low-conducting material. Thus, contact resistance and/or latch-up robustness associated with conductive fillings in narrow contact holes may be improved by the auxiliary layer.

For example, a mole fraction of components of the auxiliary layer other than silicon or nitrogen is 30% or less. For example, the mole fraction of components other than silicon or nitrogen may vary along a thickness direction. For example, a mole fraction of oxygen in a first part of the auxiliary layer may be larger than in a second part of the auxiliary layer, wherein the first part is arranged between the semiconductor structure and the second part of the auxiliary layer. This may be due to a transformation of a thin oxide layer covering the exposed part of the semiconductor structure into silicon oxynitride or silicon nitride constituting part of the auxiliary layer.

For example, a thickness of the auxiliary layer may be in a range from 0.3 nm to 2 nm, or from 0.5 nm to 1.5 nm. For example, the thickness may be chosen large enough for avoiding silicon regrowth caused by an AlSiCu layer over or as part of conductive material, and may be small enough for enabling an ohmic contact between the semiconductor structure and the conductive material.

For example, the auxiliary layer may be at least partly formed by a thermal nitridation process. The thermal nitridation process may be carried out in furnace, e.g. a rapid thermal processing furnace.

For example, an atmosphere surrounding the semiconductor structure during the thermal nitridation process may include $NH_3$. Other reactive nitrogen species may be used. For example, other reactive nitrogen species may be supplied by a remote plasma process or an upstream plasma process.

For example, the thermal nitridation process may include processing the semiconductor structure at temperatures ranging from 600° C. to 1100° C., or from 700° C. to 1000° C. The thermal nitridation process may be carried out for a period between 15 s and 5 min before forming the conductive material. The thermal nitridation process may include processing the semiconductor structure in a furnace, e.g. a rapid thermal processing furnace.

For example, the auxiliary layer may be at least partly formed by an atomic layer deposition, ALD process.

For example, providing the semiconductor structure may include forming at least one doped region in a semiconductor substrate by introducing dopants through a surface of the semiconductor substrate. For example, the semiconductor substrate may include a CZ or FZ silicon wafer having none, one or more semiconductor layers thereon, for example. The surface may be a front or top surface of the semiconductor substrate, e.g. a surface over which bond wires are used to provide an electric connection to bond pads of the semiconductor device. The at least one doped region may be formed by a masked or unmasked ion implantation process and/or a diffusion process using a gaseous or solid diffusion source, for example. The method may further include forming an interlayer dielectric on the first surface of the semiconductor substrate. For example, the interlayer dielectric may be a first dielectric arranged between the semiconductor structure and a first wiring level, e.g. a first metallization layer of a wiring area over the semiconductor structure. The method may further include patterning the interlayer dielectric by forming at least one opening in the interlayer dielectric for exposing the part of the semiconductor structure. For example, the at least one opening may be a contact opening or a contact hole arranged between the first wiring layer and active device regions, e.g. doped semiconductor regions in the semiconductor structure. Patterning the interlayer dielectric may include a lithographic patterning process, for example.

For example, the method may include, after patterning the interlayer dielectric, exposing the part of the semiconductor structure by forming at least one groove in the semiconductor substrate at the first surface by etching the semiconductor substrate in a portion below the at least one opening in the interlayer dielectric. For example, a mask used for patterning the interlayer dielectric may also be used for forming the at least one groove in the semiconductor substrate. For example, etchants may differ with respect to the at least one opening in the interlayer dielectric and the at least one groove in the semiconductor substrate.

For example, the auxiliary layer may completely line the exposed part of the semiconductor structure.

For example, the auxiliary layer may line opposite sidewalls of the at least one opening in the interlayer dielectric. For example, the auxiliary layer may cover a total side surface of the least one opening in the interlayer dielectric. After forming the auxiliary layer, a part of the auxiliary layer covering a top surface of the interlayer dielectric may be removed, for example.

For example, the method may further include forming a first load contact or load terminal over the first surface of the semiconductor structure and forming a second load contact or load terminal over a second surface of the semiconductor structure, wherein the second surface is opposite to the first surface. The first surface may be a front or top surface of the semiconductor structure. At the first surface, a wiring area may be formed. For example, bond pads may be formed at the first main surface, for example. The second surface may be a rear or back surface of the semiconductor structure. The semiconductor device may be arranged on a carrier, e.g. a lead frame, via the second surface. The first load contact may be an emitter contact or an emitter electrode of an IGBT or a bipolar transistor, or may be an anode or cathode contact or an anode or cathode electrode, or may be a source electrode or a source contact of an IGFET. In addition to the first load contact over the first surface of the semiconductor structure, other contacts may be formed. For example, one or more control contacts may be formed over the first surface of the semiconductor structure, e.g. a gate contact or a gate electrode of an IGBT or IGFET, or a base contact or base electrode of a bipolar transistor. The second load contact may be a collector contact or a collector electrode of an IGBT or a bipolar transistor, or may be a cathode or an anode contact or a cathode or an anode electrode, or may be a source electrode or a source contact of an IGFET. For example, the second load contact may cover a complete rear surface of the semiconductor structure.

For example, the semiconductor device may be a power semiconductor device configured to conduct a load current of more than 1 A.

For example, part of the semiconductor structure directly adjoining the auxiliary layer may be at least one of a source region, an emitter region, a body region, a body contact region, a cathode region, and an anode region.

Structural and/or functional details described above for features, e.g. the auxiliary layer or the conductive material, likewise apply to corresponding features described below with respect to the semiconductor device or the figures.

A further example of the present disclosure relates to a semiconductor device. The semiconductor device may include a semiconductor structure. The semiconductor device may further include an auxiliary layer directly on a part of the semiconductor structure. Silicon and nitrogen may be the main components of the auxiliary layer. The semiconductor device may further include a conductive material on the auxiliary layer. The conductive material may include AlSiCu, AlSi or tungsten, and is electrically connected to the part of the semiconductor structure via the auxiliary layer.

For example, the conductive material may be a contact plug electrically interconnecting the semiconductor structure and a wiring layer. The wiring layer may be a metallization layer of a wiring area. For example, the wiring layer may be arranged at a smallest vertical distance to the semiconductor structure with respect to all wiring layers of the wiring area over the semiconductor structure. For example, the wiring layer may be the first out of one or numerous wiring layers that is formed above the semiconductor structure.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Referring to the schematic cross-sectional view at the top of FIG. 1, a semiconductor structure 102 is provided. The semiconductor structure 102 may include a semiconductor substrate, e.g. a CZ or FZ silicon wafer having none, one or more semiconductor layers thereon, for example.

Referring to the schematic cross-sectional view in the middle of FIG. 1, an interlayer dielectric 110 is formed on a first surface 103 of the semiconductor substrate structure. The interlayer dielectric 110 is patterned by forming an opening 114, e.g. a contact hole, in the interlayer dielectric 110. Thereby, a part of the semiconductor structure 102 is exposed. An auxiliary layer 104 is formed on the exposed part of the semiconductor structure 102. Silicon and nitrogen are main components of the auxiliary layer 104. In addition, the auxiliary layer 104 may be formed at sidewalls and on a surface of the interlayer dielectric 110 (not illustrated in FIG. 1, see FIGS. 3 and 4), e.g. when forming the auxiliary layer 104 by thermal nitridation or by atomic layer deposition, ALD.

Referring to the schematic cross-sectional view at the bottom of FIG. 1, a conductive material 106 is formed on the auxiliary layer 104. The conductive material 106 includes AlSiCu, AlSi, tungsten or polycrystalline silicon and is electrically connected to the part of the semiconductor structure 102 via the auxiliary layer 104. The conductive material may form a contact plug or contact line as well as a first wiring level, e.g. a first wiring layer over the first surface 103 of the semiconductor structure 102.

Figure 2:
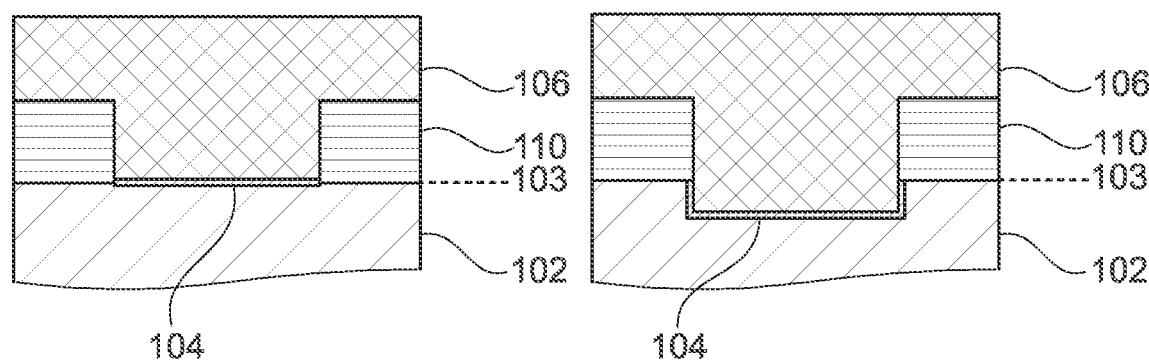
FIG. 2 includes schematic cross-sectional views for illustrating an example of a method of manufacturing an auxiliary layer lining sidewalls and a bottom of a groove of a first surface of a semiconductor structure of a semiconductor device.

Referring to the schematic cross-sectional view of FIG. 2, another example of a method of manufacturing a semiconductor device is illustrated. The method illustrated in FIG. 2 differs from the method illustrated in FIG. 1 by an additional formation of a groove in the semiconductor structure 102 at the first surface 103 by etching the semiconductor structure 102 in a portion below the opening 114. This allows for providing an electric contact to the semiconductor structure 102 not only via a bottom side of the conductive material 106 but also via part of a side surface of the conductive material 106. The auxiliary layer 104 lines opposite sidewalls and a bottom side of the groove extended opening 114 in the interlayer dielectric 110. In addition, the auxiliary layer 104 may be formed at sidewalls and on a surface of the interlayer dielectric 110 (not illustrated in FIG. 1, see FIGS. 3 and 4), e.g. when forming the auxiliary layer 104 by thermal nitridation or by atomic layer deposition, ALD.

In addition to the process features illustrated in the schematic cross-sectional views of FIGS. 1 and 2, further processes may be carried out for forming the semiconductor device. Some of the additional processes may be carried out before the processes illustrated in FIGS. 1 and 2. Some other processes may be carried out after the processes illustrated in FIGS. 1 and 2. Yet other processes may be carried out together with or between processes illustrated in FIGS. 1 and 2.

Figure 3:
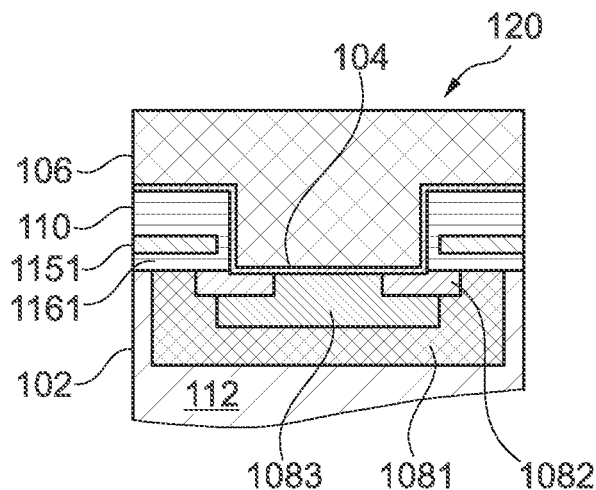
FIGS. 3 to 8 are schematic cross-sectional views of semiconductor devices including an auxiliary layer arranged between the semiconductor structure and the conductive material.

The process features illustrated in FIG. 1 may be part of a method of manufacturing a semiconductor device 120 comprising a planar gate IGFET or IGBT as is illustrated in the schematic cross-sectional view of FIG. 3. The planar gate IGFET or IGBT includes a planar gate electrode 1151 and a planar gate dielectric 1161. The semiconductor structure 102 comprises a semiconductor substrate 112 including a body region 1081 and a body contact region 1083 having a larger doping concentration than the body region 1081. The semiconductor structure 102 further includes a source region 1082. The source region 1082 and the body contact region 1083 directly adjoin the auxiliary layer 104 and are electrically connected to the conductive material 106 via the auxiliary layer 104.

Figure 4:
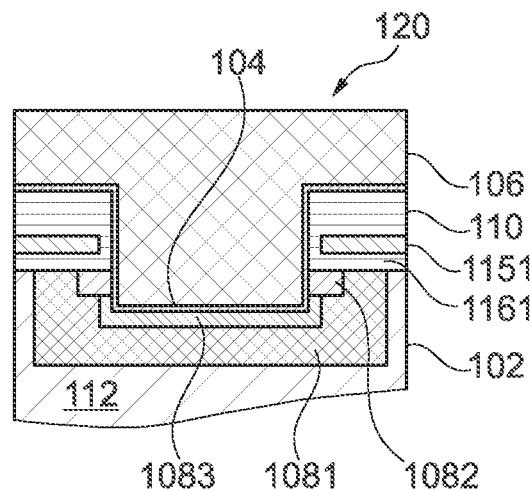

The process features illustrated in FIG. 2 may be part of a method of manufacturing a semiconductor device 120 comprising a planar gate IGFET or IGBT as is illustrated in the schematic cross-sectional view of FIG. 4. The planar gate IGFET or IGBT illustrated in FIG. 4 differs from the planar gate IGFET or IGBT illustrated in FIG. 3 by the electric contact arrangement between the auxiliary layer 104 and the semiconductor structure 102. In the example illustrated in FIG. 4, the source region 1082 is electrically connected to the conductive material 106 through a side surface of a groove in the semiconductor structure 102 that is lined by the auxiliary layer 104. Likewise, also a part of the body contact region 1083 is electrically connected to the conductive material 106 through a side surface of the groove in the semiconductor structure 102 that is lined by the auxiliary layer 104.

Figure 5:
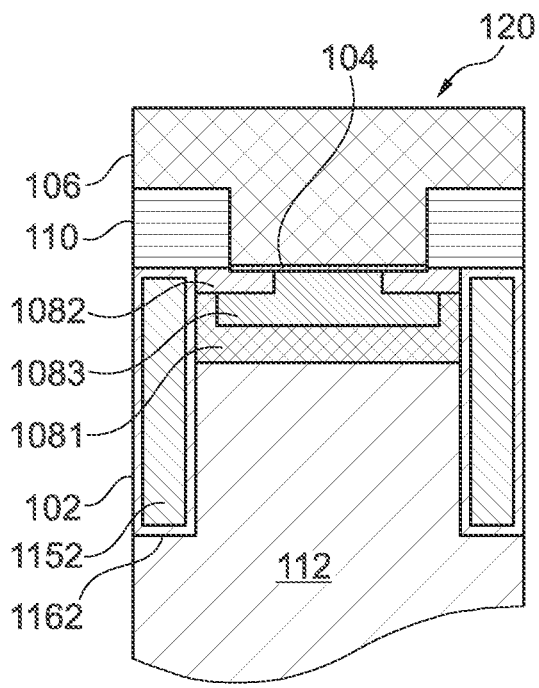

The process features illustrated in FIG. 1 may also be part of a method of manufacturing a semiconductor device 120 comprising a trench gate IGFET or IGBT as is illustrated in the schematic cross-sectional view of FIG. 5. The trench gate IGFET or IGBT includes a trench gate electrode 1152 and a trench gate dielectric 1162. The electric contact between the semiconductor structure 102 and the conductive material is similar to the examples described with reference to FIGS. 1 and 3.

Figure 6:
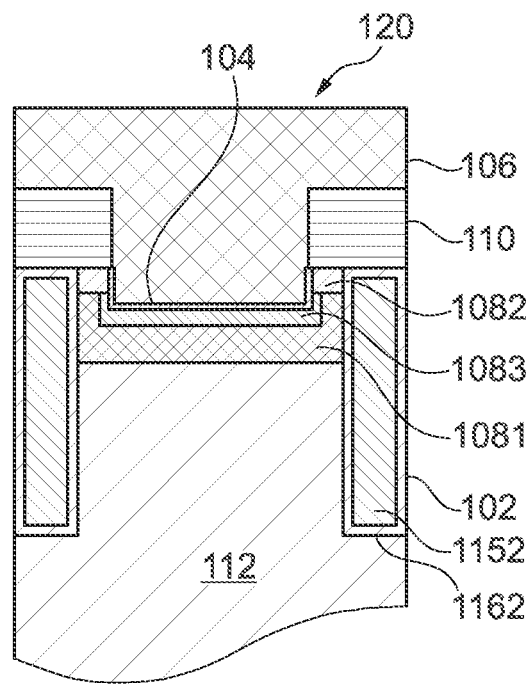

The process features illustrated in FIG. 2 may also be part of a method of manufacturing a semiconductor device 120 comprising a trench gate IGFET or IGBT as is illustrated in the schematic cross-sectional view of FIG. 6. The trench gate IGFET or IGBT includes a trench gate electrode 1152 and a trench gate dielectric 1162. The electric contact between the semiconductor structure 102 and the conductive material is similar to the examples described with reference to FIGS. 2 and 4.

Figure 7:
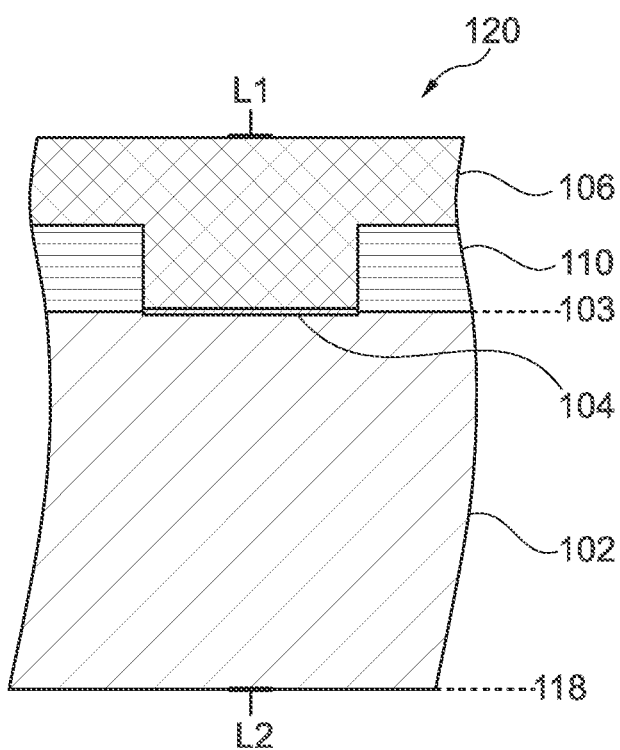
Figure 8:
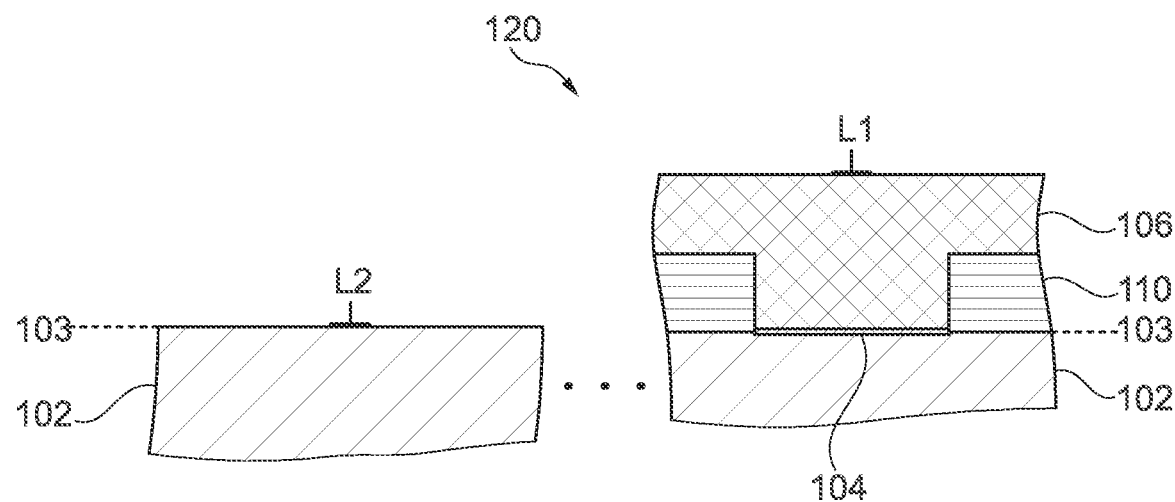

The exemplary semiconductor devices described with reference to the illustrated examples may be vertical or lateral semiconductor devices. An example of a vertical semiconductor device 120 is illustrated in the schematic cross-sectional view of FIG. 7. The semiconductor device 120 includes a first load terminal or load contact L1 over the first surface 103 of the semiconductor structure 102. The first load terminal L1 may correspond to or may be electrically connected to the conductive material 106. A second load terminal or load contact L2 is arranged over a second surface 118 of the semiconductor substrate 102. The second surface 118 is arranged opposite to the first surface 103. An example of a lateral semiconductor device 120 is illustrated in the schematic cross-sectional view of FIG. 8. Other than in FIG. 7, the second load terminal or load contact L2 of the lateral semiconductor device 120 of FIG. 8 is arranged over the first surface 103 and is laterally spaced apart from the first load terminal L1. In the vertical semiconductor device 120 of FIG. 7, the load current mainly flows along a vertical direction between the first surface 103 and the second surface 118. In the lateral semiconductor device 120 of FIG. 8, the load current mainly flows along a lateral direction parallel to the first surface 103.

The aspects and features mentioned and described together with one or more of the previously detailed examples and figures, may as well be combined with one or more of the other examples in order to replace a like feature of the other example or in order to additionally introduce the feature to the other example.

What is claimed is:

1. A method of forming a semiconductor device, the method comprising:
    providing a semiconductor;
    forming an auxiliary layer directly on a part of the semiconductor, wherein silicon and nitrogen are main components of the auxiliary layer; and
    forming a conductive material directly on the auxiliary layer such that the conductive material is separated from the semiconductor by the auxiliary layer, wherein the conductive material comprises AlSiCu or AlSi and is electrically connected to the part of the semiconductor via the auxiliary layer,
    wherein forming the auxiliary layer comprises transforming a thin oxide layer covering the part of the semiconductor into silicon oxynitride or silicon nitride constituting part of the auxiliary layer.

2. The method of claim 1, wherein a mole fraction of components of the auxiliary layer other than silicon or nitrogen is 30% or less.

3. The method of claim 1, wherein a thickness of the auxiliary layer is in a range from 0.3 nm to 2 nm.

4. The method of claim 1, wherein the auxiliary layer is at least partly formed by a thermal nitridation process.

5. The method of claim 4, wherein an atmosphere surrounding the semiconductor during the thermal nitridation process includes $NH_3$.

6. The method of claim 4, wherein the thermal nitridation process includes processing the semiconductor at temperatures ranging from 600° C. to 1100° C. for a period between 15 s and 5 min before forming the conductive material.

7. The method of claim 1, wherein the auxiliary layer is at least partly formed by an atomic layer deposition (ALD) process.

8. The method of claim 1, wherein providing the semiconductor comprises:
    forming at least one doped region in a semiconductor substrate by introducing dopants through a first surface of the semiconductor substrate;
    forming an interlayer dielectric on the first surface of the semiconductor substrate; and
    patterning the interlayer dielectric by forming at least one opening in the interlayer dielectric that exposes the part of the semiconductor.

9. The method of claim 8, further comprising:
    after patterning the interlayer dielectric, exposing the part of the semiconductor by forming at least one groove in the semiconductor substrate at the first surface by etching the semiconductor substrate in a portion below the at least one opening in the interlayer dielectric.

10. The method of claim 8, wherein the auxiliary layer completely lines the exposed part of the semiconductor.

11. The method of claim 8, wherein the auxiliary layer lines opposite sidewalls of the at least one opening in the interlayer dielectric.

12. The method of claim 1, further comprising:
    forming a first load contact over a first surface of the semiconductor; and
    forming a second load contact over a second surface of the semiconductor, wherein the second surface is opposite to the first surface.

13. The method of claim 1, wherein the semiconductor device is a power semiconductor device configured to conduct a load current of more than 1A.

14. The method of claim 1, wherein the part of the semiconductor directly adjoining the auxiliary layer is at least one of a source region, an emitter region, a body region, a body contact region, a cathode region, and an anode region.

15. The method of claim 1, wherein a mole fraction of components of the auxiliary layer other than silicon or nitrogen varies along a thickness direction of the auxiliary layer.

16. The method of claim 1, wherein a mole fraction of oxygen in a first part of the auxiliary layer is larger than in a second part of the auxiliary layer, and wherein the first part is arranged between the semiconductor and the second part of the auxiliary layer.

17. A method of forming a semiconductor device, the method comprising:
    providing a semiconductor;
    forming a groove in the semiconductor at a first surface of the semiconductor;
    forming an auxiliary layer that directly lines opposite sidewalls and a bottom side of the groove, wherein silicon and nitrogen are main components of the auxiliary layer; and
    forming a conductive material directly on the auxiliary layer such that the conductive material is separated from the semiconductor by the auxiliary layer, wherein the conductive material comprises AlSiCu or AlSi and is electrically connected to the semiconductor through the auxiliary layer such that an electric contact is provided to the semiconductor via a bottom side of the conductive material disposed along the bottom side of the groove and via part of a side surface of the conductive material disposed along the opposite sidewalls of the groove.

18. The method of claim 17, wherein forming the auxiliary layer comprises transforming a thin oxide layer covering the opposite sidewalls and the bottom side of the groove into silicon oxynitride or silicon nitride constituting part of the auxiliary layer.

19. The method of claim 17, wherein a mole fraction of components of the auxiliary layer other than silicon or nitrogen varies along a thickness direction of the auxiliary layer.

20. The method of claim 17, wherein a mole fraction of oxygen in a first part of the auxiliary layer is larger than in a second part of the auxiliary layer, and wherein the first part is arranged between the semiconductor and the second part of the auxiliary layer.

\* \* \* \* \*